(12) United States Patent
Yan

(10) Patent No.: US 8,963,759 B2
(45) Date of Patent: Feb. 24, 2015

(54) IMAGING SYSTEMS WITH PER-COLUMN ANALOG-TO-DIGITAL CONVERTER NON-LINEARITY CORRECTION CAPABILITIES

(71) Applicant: Aptina Imaging Corporation, George Town (KY)

(72) Inventor: Hai Yan, San Ramon, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 52 days.

(21) Appl. No.: 13/867,971

(22) Filed: Apr. 22, 2013

(65) Prior Publication Data

US 2013/0300906 A1 Nov. 14, 2013

Related U.S. Application Data

(60) Provisional application No. 61/642,377, filed on May 3, 2012.

(51) Int. Cl.
*H03M 1/12* (2006.01)
*H04N 5/378* (2011.01)

(52) U.S. Cl.
CPC .................................... *H04N 5/378* (2013.01)
USPC ........................................ 341/156; 341/155

(58) Field of Classification Search
USPC ........ 341/122, 155, 156, 169; 348/308, 222.1
See application file for complete search history.

(56) References Cited

U.S. PATENT DOCUMENTS

| | | | |
|---|---|---|---|
| 8,072,512 B2 * | 12/2011 | Lee et al. ....................... | 348/241 |
| 8,305,474 B2 | 11/2012 | Purcell et al. | |
| 8,339,300 B2 | 12/2012 | Asayama et al. | |
| 8,606,051 B2 * | 12/2013 | Wang et al. ................... | 382/312 |
| 8,624,769 B2 * | 1/2014 | Wrigley et al. ............... | 341/155 |
| 2012/0249850 A1 | 10/2012 | Hagihara | |
| 2013/0009800 A1 * | 1/2013 | Yang et al. .................... | 341/155 |
| 2013/0021493 A1 * | 1/2013 | Ishibashi .................... | 348/222.1 |

FOREIGN PATENT DOCUMENTS

EP 2421155 8/2010

* cited by examiner

*Primary Examiner* — Peguy Jean Pierre
(74) *Attorney, Agent, or Firm* — Treyz Law Group; Jason Tsai

(57) ABSTRACT

Electronic devices may include image sensors having image sensor pixels that are coupled to analog-to-digital converters (ADCs). Each ADC may be a sub-ranged ramp ADC that uses a first set of reference voltages to determine a coarse code and a second set of ramping voltages to determine a fine code. In the presence of parasitic capacitances, the reference voltages and the ramp voltages exhibit mismatch that causes the ADC to exhibit non-idealities such as missing codes. Calibration operations may be performed that involve obtaining a first code at a first predetermined input voltage level and obtaining a second code at a second predetermined input voltage level. A code correction value can then be computed based on the first and second codes. The code correction value can be selectively applied to the final ADC code to correct for missing codes.

17 Claims, 8 Drawing Sheets

IMAGING SYSTEMS WITH PER-COLUMN ANALOG-TO-DIGITAL CONVERTER NON-LINEARITY CORRECTION CAPABILITIES

This application claims the benefit of provisional patent application No. 61/642,377, filed May 3, 2012, which is hereby incorporated by reference herein in its entirety.

BACKGROUND

This invention relates generally to imaging devices, and more particularly, to imaging devices with data converting circuits.

Image sensors are commonly used in electronic devices such as cellular telephones, cameras, and computers to capture images. In a typical arrangement, an electronic device with an image sensor is provided with an array of image sensor pixels arranged in pixel rows and columns.

One type of conventional image sensor features analog-to-digital converter (ADC) circuits each of which is connected to a corresponding column in the image pixel array. The ADC circuits receive signals from image sensor pixels in a selected row via column lines. The ADC circuits may be implemented using a ramp ADC architecture. A ramp ADC may exhibit low power consumption but may require high clock speeds to ensure that the desired frame rate is met.

One way of achieving improved frame rates using the ramp ADC architecture involves dividing the entire ADC range into multiple sub-ranges. A coarse comparison may first be performed to determine in which one of the sub-ranges fine comparison operations should be performed. The coarse comparison determines the most significant bits. Subsequently, fine comparison operations are performed in a selected one of the sub-ranges to determine the remaining least significant bits. This type of data conversion is sometimes referred to as the sub-ranged ramp ADC architecture.

In practice, however, sub-ranged ramp ADCs often suffer from nonlinearity issues such as differential nonlinearity (DNL) when parasitic elements are present. This degraded DNL performance causes the ADC to deviate from its ideal transfer characteristic, resulting in undesired artifacts in the final image. It would therefore be desirable to be able to provide imaging devices having sub-ranged ramp ADCs with improved linearity.

DETAILED DESCRIPTION

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
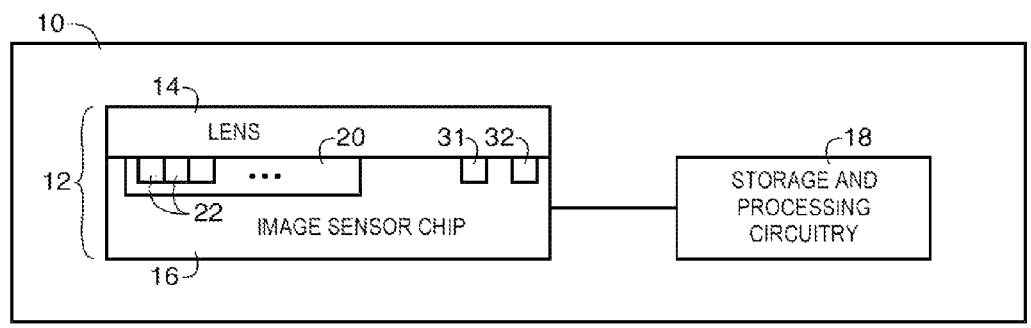
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 15. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Figure 2:
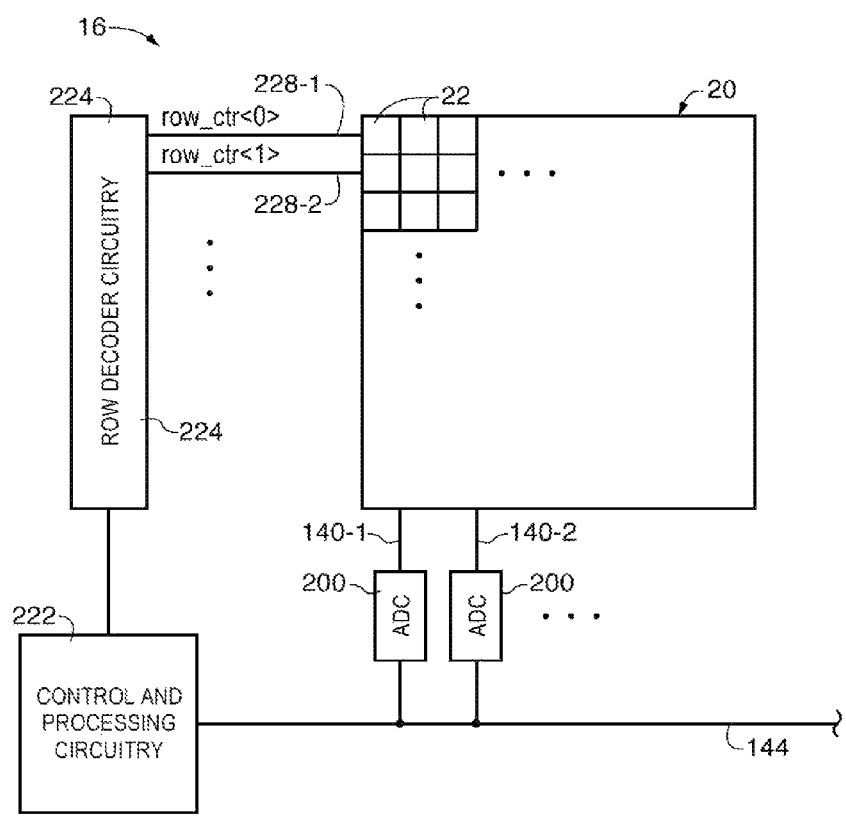
FIG. 2 is a diagram of an illustrative image sensor having an image pixel array and associated analog-to-digital converter (ADC) circuitry in accordance with an embodiment of the present invention.

The analog circuitry on image sensor 16 may include data converting circuitry such as analog-to-digital converter (ADC) circuitry for converting the analog signals generated by pixels 22 into digital signals. FIG. 2 is a diagram of an image sensor 16 that includes ADC circuitry coupled to each pixel column of an image pixel array.

Image sensor 16 may include control and processing circuitry 222 and image sensor pixel array 20 containing image sensor pixels 22. Circuitry 222 may be coupled to row decoder circuitry 224 and global data path 144. Row decoder circuitry 224 may receive row addresses from control circuitry 222 and supply corresponding row control signals row_ctr such as pixel reset signals, pixel row-select signals, charge storage gate transfer signals, and other row control signals to image pixels 22 over control paths 228.

Image pixels 22 in each column of image pixel array 20 may be coupled to a corresponding column line 140 (e.g., image pixels 22 in a first pixel array column may be connected to column readout line 140-1, image pixels 22 in a second pixel array column may be connected to column line 140-2, etc.). Column lines 140 may be used for reading out image signals from image pixels 22 and for supplying bias signals (e.g., bias currents or bias voltages) to image pixels 22. During image pixel readout operations, a pixel row in array 20 may be selected using row decoder circuitry 224 and image data associated with image pixels 22 in that pixel row can be read out along column lines 140. Each column line 140 may be coupled to corresponding column circuitry such as column amplifiers, memory circuits, and data converting circuitry such as analog-to-digital converter 200. Configured in this arrangement, each ADC 200 may be used to perform per-column data conversion.

Figure 3:
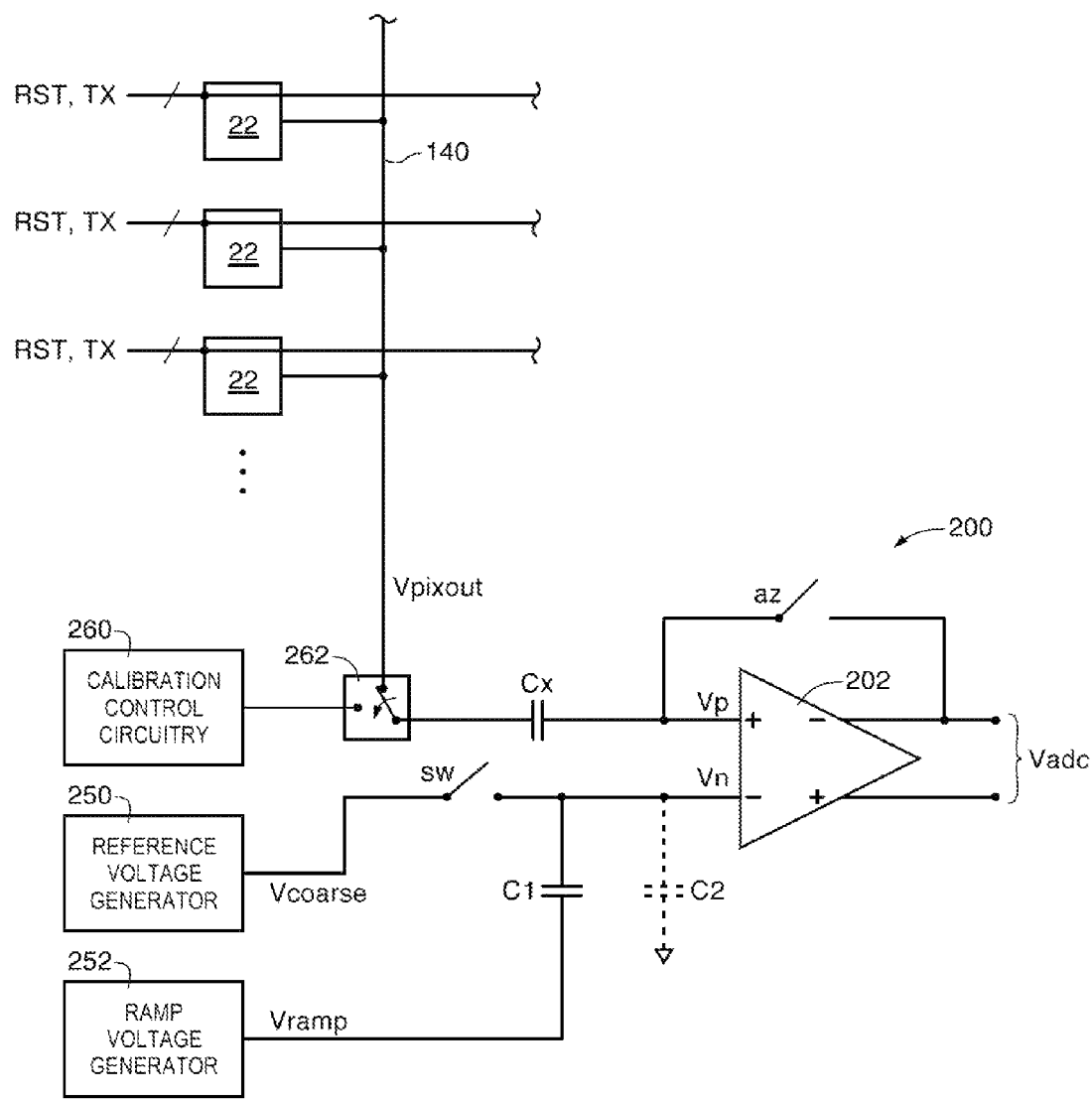
FIG. 3 is a diagram of an illustrative sub-ranged ramp ADC in accordance with an embodiment of the present invention.

Analog-to-digital converters 200 may be implemented using a ramp-compare ADC architecture such as a sub-ranged ramp ADC architecture. FIG. 3 is a circuit diagram of sub-ranged ramp analog-to-digital converter 200. As shown in FIG. 3, converter 200 may include a comparator circuit such as comparator 202 operable to receive signals from a selected one of pixels 22 via column readout line 140 and to receive signals from voltage generation circuits such as a reference voltage generator 250 and ramp voltage generator 252.

In the example of FIG. 3, comparator 202 may be a differential comparator having a first (positive) input terminal that is coupled to column output line 140 via a first capacitor Cx and switch 262 during normal operation. Image pixels 22 may be controlled using row control signals such as reset signal RST and charge transfer control signal TX to present a corresponding pixel output signal Vpixout on line 140. For example, signal RST may be asserted to present a reset level Vshr onto output line 140 during reset phase, whereas signal TX may be asserted to present an image signal level Vshs onto output line 140 during signal readout phase. Pixel output signal Vpixout may be sampled using capacitor Cx so that a sampled pixel output signal is presented at the first (+) input of comparator 202. The voltage signal presented at the first input terminal of comparator 202 may be referred to as signal Vp. During calibration operation, however, the first input terminal of comparator 202 may instead be coupled to calibration control circuitry 260 (e.g., by changing the state of switch 262). Configured in this arrangement, the voltage at Vp may be overridden using circuitry 260 for calibration purposes.

Comparator 202 may have a second (negative) input terminal that is selectively coupled to reference voltage generator 250 via a switching circuit (e.g., a switch that is controlled by signal sw) and that is coupled to ramp voltage generator 252 via a second capacitor C1. The voltage signal presented at the second input of comparator 202 may be referred to as signal Vn. When the switch is turn on (i.e., when signal sw is asserted), reference voltage generator 250 may actively drive signal Vn at the second input of comparator 202 to some reference voltage level to perform a coarse comparison (e.g., comparator 202 may receive signal Vcoarse at its second input). When the switch is turned off (i.e., when signal sw is deasserted), ramp voltage generator 252 may then be used to ramp down signal Vn to perform a fine comparison (e.g., comparator 202 may receive a gradually decreasing ramp signal Vramp at its second input). The coarse comparison may serve to divide an input range of the ADC into multiple "sub-ranges" (for determining the most significant bits of an ADC output code) while the fine comparison may only be performed in a selected one of the sub-ranges (for determining the remaining least significant bits of the ADC output code).

Comparator 202 may have a first (positive) output terminal and a second (negative) output terminal across which ADC output signal Vadc is generated. Comparator 202 may drive signal Vadc high when positive input signal Vp exceeds negative input signal Vn and may drive signal Vadc low when negative input signal Vn exceeds positive input Vp. An auto-zeroing switch (e.g., a switch that is controlled by signal az) may be coupled between the first (+) input terminal and the second (−) output terminal of comparator 202. The auto-zeroing switch may be turned on during initialization operations to remove any offset associated with comparator 202.

Figure 4:
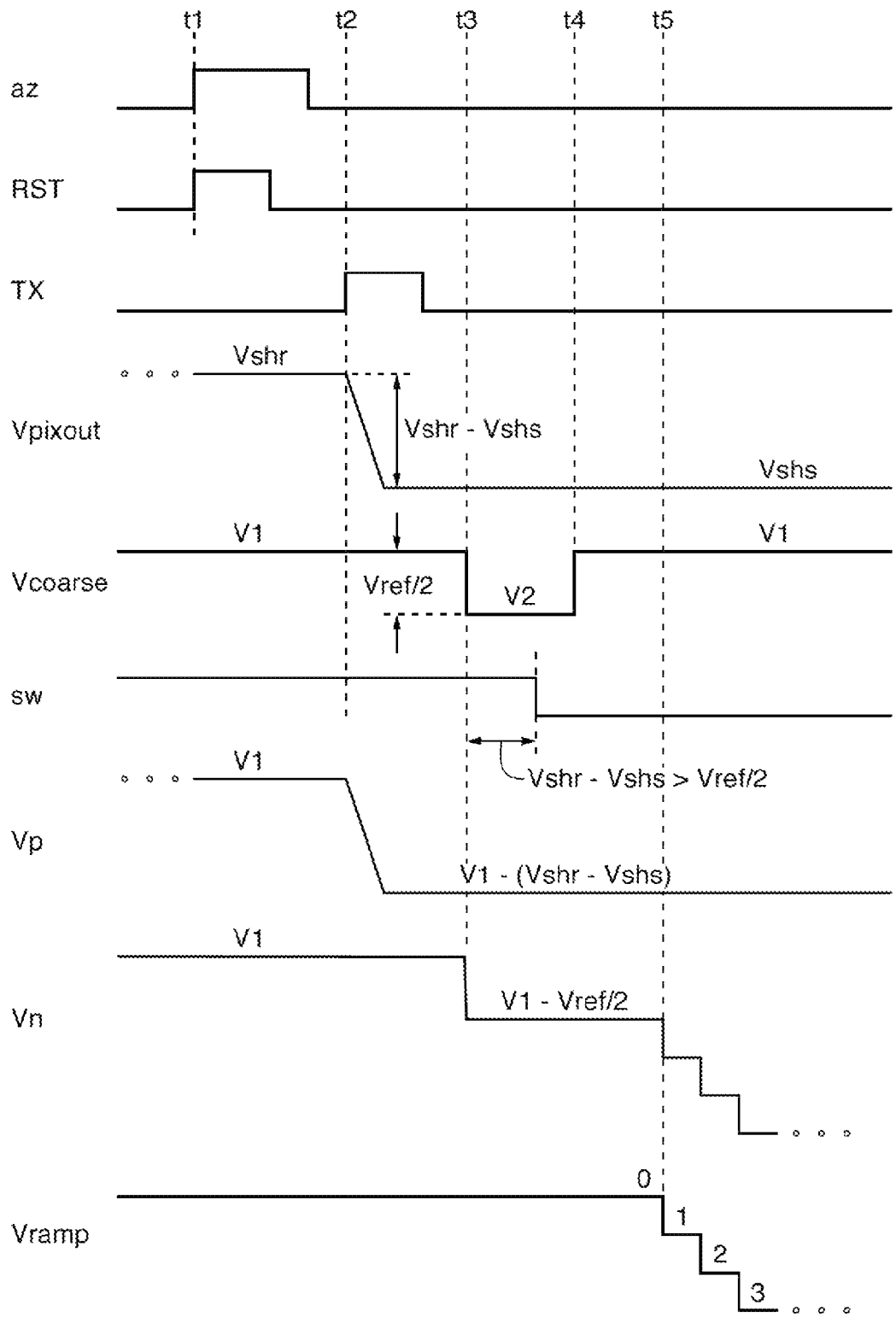
FIGS. 4 and 5 are timing diagrams illustrating the operation of the sub-ranged ramp ADC of the type shown in FIG. 3 in accordance with an embodiment of the present invention.
Figure 5:
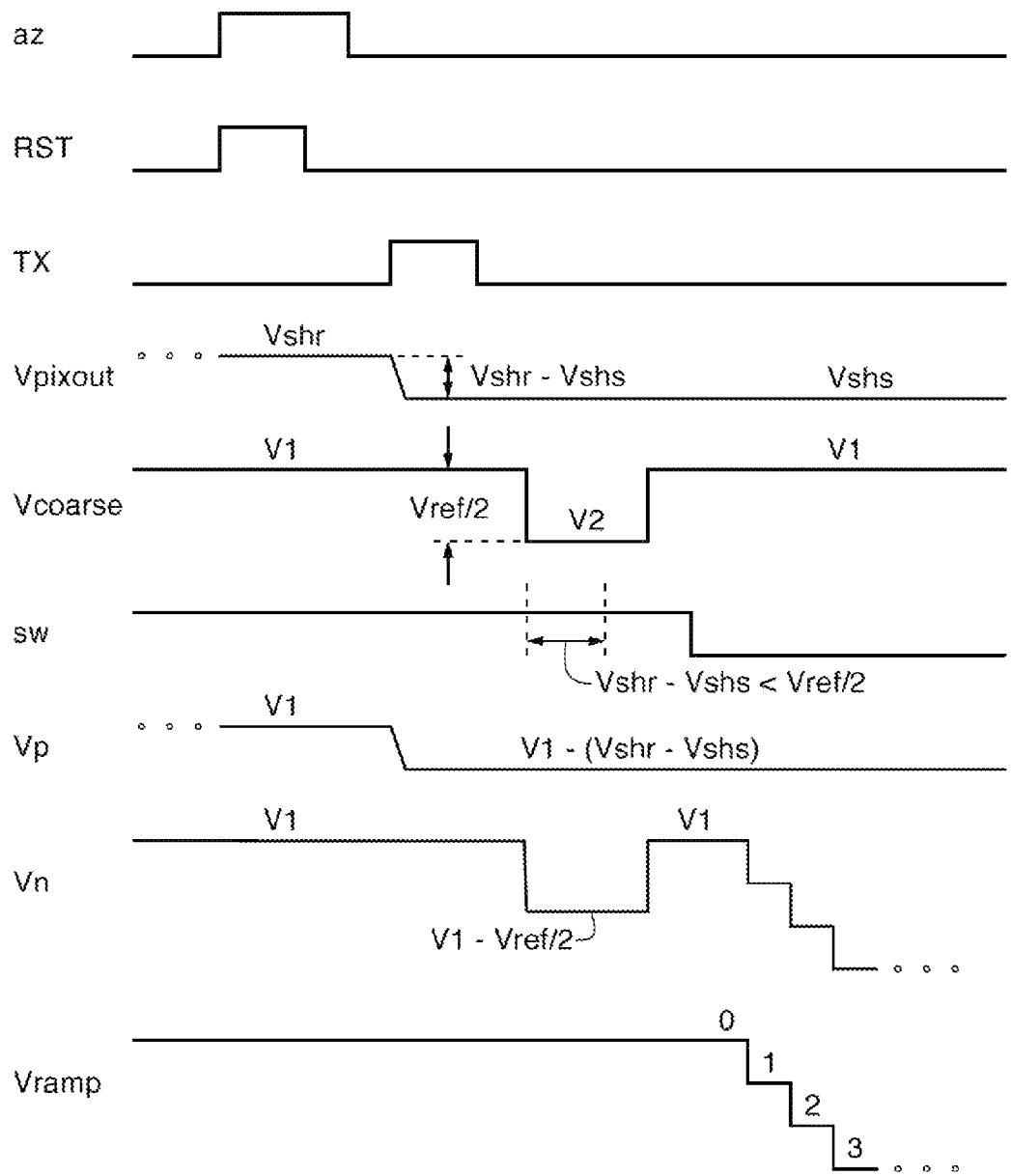

FIGS. 4 and 5 are timing diagrams for illustrating the operation of a sub-ranged ramp ADC such as converter 200. FIG. 4 shows a scenario in which the difference between reset level Vshr and image signal level Vshs is greater than a predetermined coarse comparison threshold amount. Prior to time t1, signal Vcoarse may be driven to a first predetermined voltage level V1, thereby setting comparator input signal Vn to voltage level V1 (e.g., signal sw is asserted to allow reference voltage generator 250 to actively drive signal Vn). The magnitude of V1 may be chosen based on considerations to the input common voltage of comparator 202 and to the output swing of a buffer within generator 250 that is driving Vcoarse.

At time t1 (during reset phase), signal az and RST may be temporarily pulsed high to perform offset cancellation and reset operations, respectively. Signal az may be asserted longer than RST to allow any charge injection introduced by deassertion of RST to settle. Assertion of signal az may set comparator input signal Vp to voltage level V1 because of virtual ground. Assertion of signal RST may set signal Vpixout to reset voltage level Vshr. This reset level may be sampled using capacitor Cx by deasserting signal az after RST.

At time t2 (during signal readout phase), signal TX may be pulsed high to set signal Vpixout to the image pixel signal level Vshs (see, e.g., Vpixout drops from Vshr to Vshs). Since the voltage across capacitor Cx has nowhere to discharge, a drop in signal Vpixout at one terminal of Cx will result in a corresponding voltage drop at the other terminal of Cx. In other words, signal Vp may decrease by an amount that is equal to the difference between Vshr and Vshs (e.g., Vp may be lowered by a difference that is equal to Vshr minus Vshs). During this time, Vcoarse stays at voltage level V1 (e.g., Vn remains at V1).

At time t3, the change of Vp (i.e., Vshr−Vshs) may then be converted to a digital code by first determining a "coarse code" and then a "fine code." For example, reference voltage generator 250 may toggle Vcoarse by driving Vcoarse from voltage level V1 to voltage level V2. In this example, the difference between V1 and V2 is equal to half a reference voltage (e.g., V2 is equal to V1 minus Vref/2). This may also cause input signal Vn to drop by Vref/2. While Vcoarse is equal to V2 and while signal sw is asserted, a coarse voltage comparison operation may be performed by determining whether positive input signal Vp is currently greater than or less than negative input signal Vn. Effectively, comparator 202 is being used to determine whether the difference between Vshr and Vshs is greater than Vref/2. This determination generates a corresponding "coarse code" (e.g., the most significant bits of the final ADC output code).

In the example of FIG. 4, the difference (i.e., Vshr minus Vshs) is greater than Vref/2 and as a result, signal sw is deasserted before Vcoarse is driven back up to V1 (at time t4). At time t5, ramp voltage generator 252 may be used to ramp down signal Vn by monotonically stepping down Vramp (as an example). While Vn is ramped down, comparator 202 may be used to monitor when Vadc toggles for determining a corresponding fine code (e.g., the least significant bits of the final ADC output code). The coarse code therefore has a degree of accuracy that is less than that of the fine code. The coarse code is typically obtained before obtaining the fine code.

FIG. 5 shows a scenario in which the difference between the reset level and the image signal level is greater than the predetermined coarse comparison amount (e.g., the difference between Vshr and Vshs is less than Vref/2). When this difference is less than Vref/2, signal sw may be deasserted after Vcoarse is driven back up to V1. This sets signal comparator input signal Vn back to V1 before the fine ramping begins. Once Vn is driven back to V1, signal Vn may be ramped down to determining the corresponding fine code.

Figure 6:
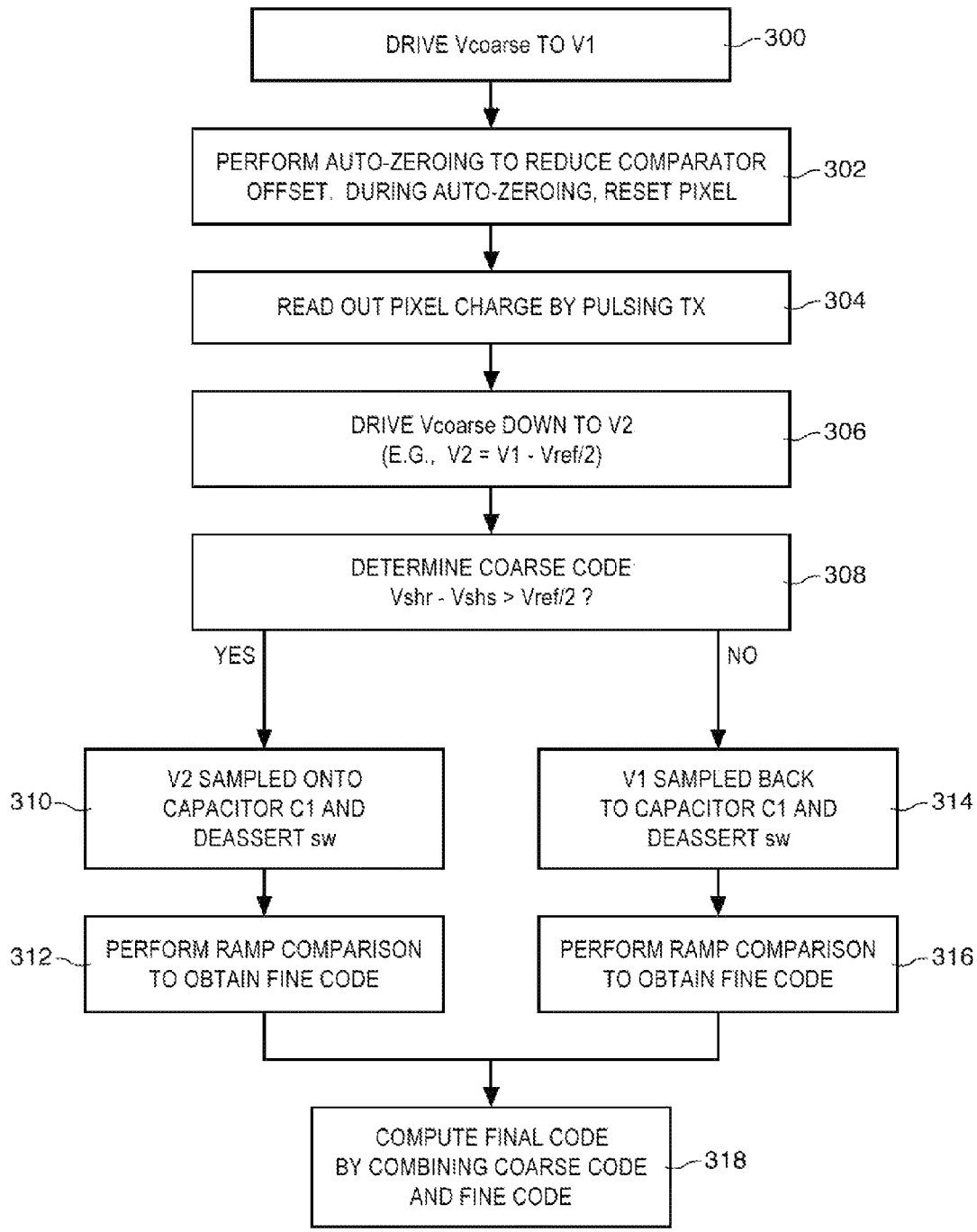
FIG. 6 is a flow chart of illustrate steps for operating a sub-ranged ramp ADC in accordance with an embodiment of the present invention.

FIG. 6 is a flow chart of illustrative steps summarizing the operation of sub-ranged ramp ADC 200. At step 300, reference voltage generator 250 may be configured to drive Vcoarse to a first predetermined voltage level V1. At step 302, auto-zeroing and reset operations may be performed to reduce comparator offset and to reset pixels 22, respectively (e.g., by pulsing signal az and RST high). The pixel reset level may be sampled onto the first input of comparator 202.

At step 304, an image pixel signal level may be read out by pulsing signal TX high. This causes the voltage level at the first input of comparator 202 to drop by an amount that is proportional to the image signal level (e.g., signal Vp may drop by a given amount that is equal to the difference between the reset level and the image signal level).

At step 306, reference voltage generator 250 may be configured to toggle Vcoarse by driving Vcoarse to a second predetermined voltage level V2. In the example of FIGS. 4 and 5 in which there are only two coarse sub-ranges, V2 may be equal to V1 minus Vref/2 (e.g., Vcoarse may be lowered by Vref/2). At step 308, comparator 202 may be used to determine whether or not the given voltage drop amount (e.g., Vshr minus Vshs) is greater than Vref/2. The result of this comparison may yield a corresponding coarse code.

If the given amount is greater than Vref/2 (e.g., if the coarse code is a logic "1"), voltage V2 may be sampled onto capacitor C1 and signal sw may be deasserted (at step 310). At a subsequent step 312, a fine ramp comparison operation may be performed to obtain a corresponding fine code.

If the given amount is less than Vref/2 (e.g., if the coarse code is a logic "0"), voltage V1 may be sampled back onto capacitor C1 before signal sw is deasserted (at step 314). At a subsequent step 316, a fine ramp comparison operation may be performed to obtain a corresponding fine code.

At step 318, a final (raw) ADC output code may be computed by combining the coarse code and fine code (e.g., by concatenating the coarse code and the fine code). The use of sub-ranged ramp A/D conversion of this type may enable the use of higher frame rates compared to conventional single-sloped ramp ADC architectures. For example, sub-ranged ramp A/D converters may be used to support 60 fps (frames per second) operation, where each frame contains at least 12 Megapixels.

Figure 7:
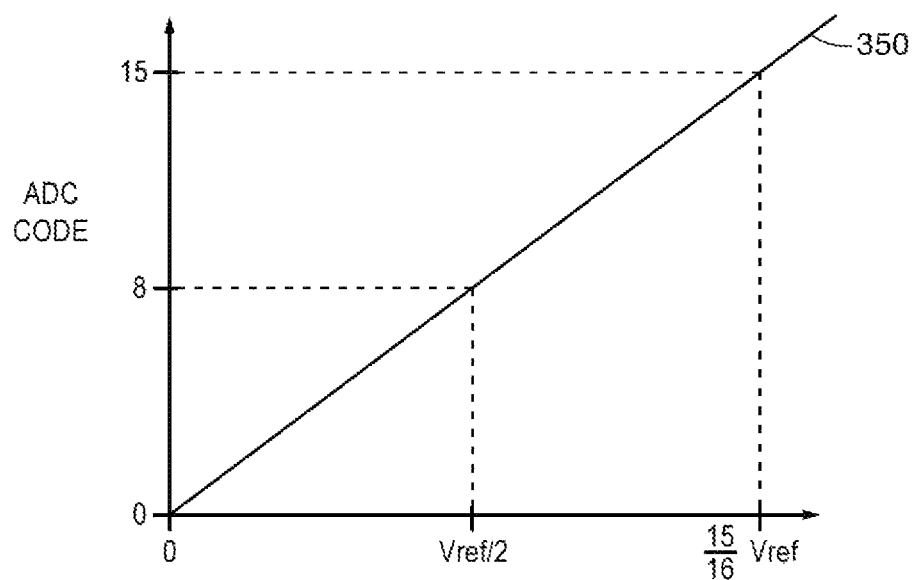
FIG. 7 is a diagram of an ideal ADC transfer curve in accordance with an embodiment of the present invention.

FIG. 7 is a diagram of an ideal transfer curve 350 of a 4-bit sub-ranged ramp ADC with two input sub-ranges and eight fine ramp steps in each of the two sub-ranges. The two sub-ranges may be divided at a predetermined comparison threshold of Vref/2. An analog input signal that is less than Vref/2 may yield a low coarse bit value, whereas an analog input signal that is greater than Vref/2 may yield a high coarse bit value. The coarse bit may be the most significant bit in the final ADC output code. In this example, each sub-range may be covered by eight fine ramp steps, where each ramp step is equal to Vref/16. The fine ramp steps may be used to determine the three least significant bits that make up the final ADC output code.

The transfer curve 350 of FIG. 7 is ideal because curve 350 is perfectly linear with no sudden jumps at the coarse comparison point of Vref/2. In practice, however, comparator 202 may suffer from undesired parasitic effects such as parasitic capacitance C2 at the second input of comparator 202 (see, e.g., FIG. 3). Such parasitic capacitances may include comparator input gate capacitance, junction parasitic capacitance of any switches coupled to the second input terminal, and/or other connections to that node.

The presence of parasitic capacitance C2 may create a voltage divider that only effects the fine ramp voltage comparison (e.g., the coarse code determination is not affected since reference voltage generator 250 includes a buffer that will drive Vn to the appropriate predetermined voltage levels). As a result of the voltage division, each fine ramp step is slightly reduced from its ideal amount. This is particularly problematic for sub-ranged ramp ADCs since the coarse code and the fine code will be determined using mismatched reference voltages if parasitic capacitances are present. The reference voltage mismatch may be the result of the voltage division that is introduced by the presence of parasitic capacitance C2 (e.g., any ramp voltage applied to the second comparator input during fine ramp comparison will be attenuated by a factor of C1/[C1+C2]).

Figure 8:
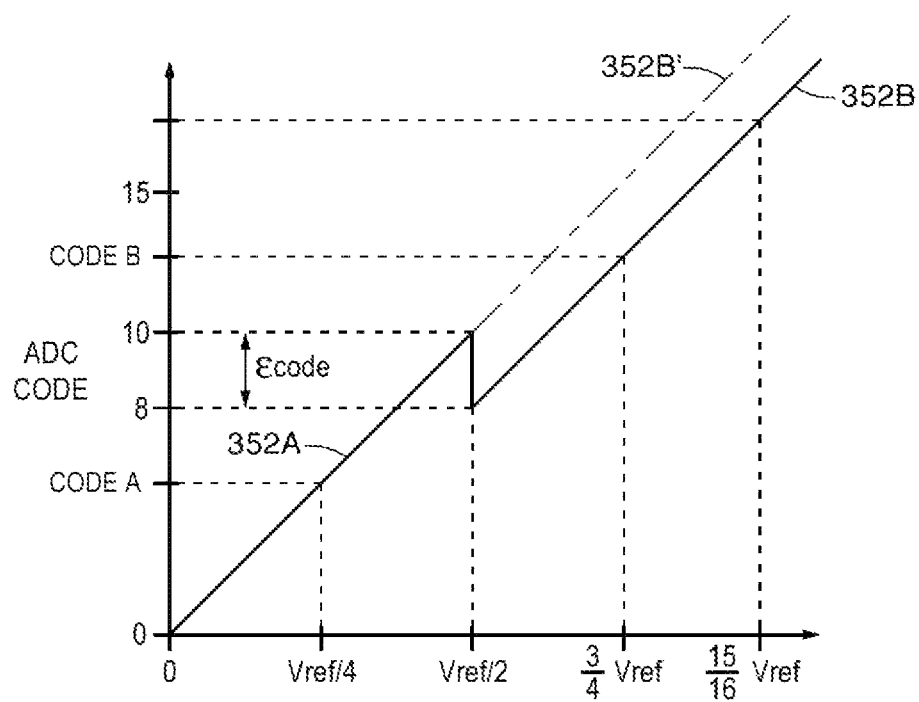
FIG. 8 is a diagram of a non-ideal ADC transfer curve in accordance with an embodiment of the present invention.

FIG. 8 is a plot of a non-ideal transfer curve for a sub-ranged ramp ADC with undesired parasitic capacitances. As shown in FIG. 8, a first curve portion 352A represents the ADC transfer characteristic for the lower analog input sub-range (i.e., the input sub-range portion that is less than Vref/2), whereas a second curve portion 352B represents the ADC transfer characteristic for upper analog input sub-range (i.e., the input sub-range portion that is greater than Vref/2).

As described above, the fine ramp step may be attenuated in the presence of parasitic capacitance C2. In the example of FIG. 8, the fine ramp may therefore generate more than eight codes before the ramp reaches Vref/2 (e.g., the fine ramp may generate 10 codes). The coarse code, however, is still obtained by comparing the input signal to Vref/2. The output code is therefore able to ramp up to a code value of 10 due to the reduced fine ramp step but then jumps down to a code value of 8 because of the coarse code change. This jump causes a discontinuity in the ADC transfer curve and may cause serious artifacts in the final image.

This type of non-ideal behavior is sometimes referred to as differential non-linearity (DNL) or is said to exhibit missing/repeated codes. It is generally desirable for image sensors to minimize DNL and to reduce the occurrence of missing/repeated codes in order to avoid artifacts such as fixed pattern noise (FPN) in the final image data. Similarly, reducing these errors may allow higher speed and power performance for A/D converter 200. It may therefore be desirable to provide ADC circuitry with non-linearity correction capabilities.

In an embodiment of the present invention, a digital correction/calibration algorithm may be used to reduce this undesired DNL. This can be accomplished by adding a calibrated correction value to all codes corresponding to input levels greater than the predetermined coarse threshold level of Vref/2 while leaving codes corresponding to input levels less than Vref/2 unchanged. In the example of FIG. 8, $\epsilon_{code}$ may represent the non-linearity code correction amount. Correction amount $\epsilon_{code}$ may be equal to the code difference at the point of ADC transfer curve discontinuity. Adding $\epsilon_{code}$ only to curve portion 352B effectively shifts the curve upwards to position 352B'. As a result, the codes are connected at Vref/2, thereby removing missing codes at the coarse code comparison level and reducing DNL. Reducing DNL in this way may be referred to as implementing a non-linearity correction/calibration algorithm.

Figure 9:
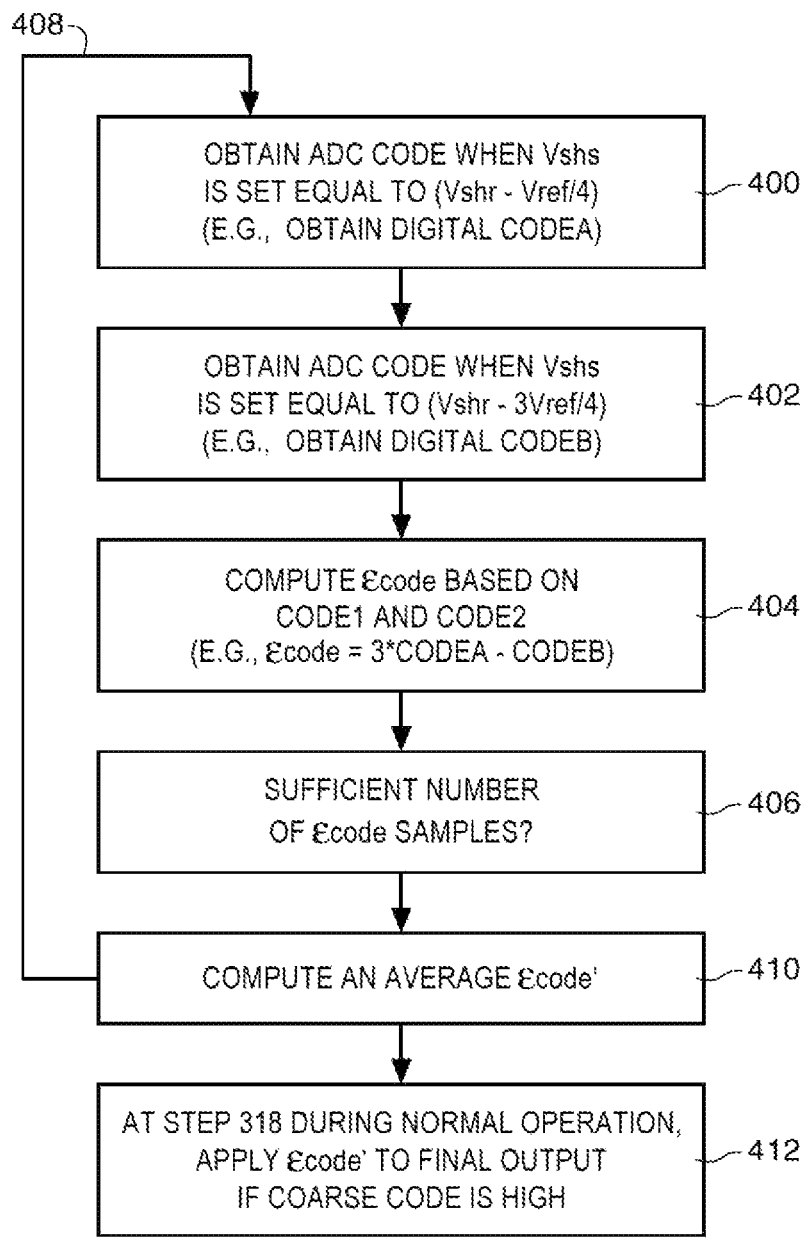
FIG. 9 is a flow chart of illustrate steps for computing a non-linearity code correction value in accordance with an embodiment of the present invention.

FIG. 9 is a flow chart of illustrative steps that can be performed during calibration to compute code correction amount $\epsilon_{code}$. Computation of $\epsilon_{code}$ may be performed at the beginning of a frame, similar to the way column fixed pattern noise (cFPN) correction is performed (as an example). During calibration, ADC 200 is decoupled from the pixel array. Instead, ADC 200 may receive signals from calibration control circuitry 260 via switch 262 (see, e.g., FIG. 3) to emulate the voltage level of Vshr and Vshs. This example in which calibration signals are generated internally on image sensor 16 is merely illustrative. If desired, calibration voltage signals may be applied externally via a test pad to emulate the voltage level of Vshr and Vshs. The comparator operation during calibration is similar to that in reading signals from an image pixel. Auto-zeroing operations may first be performed while circuitry 262 outputs a calibration signal having a typically reset level Vshr. After auto-zeroing, circuitry 260 may then output a calibration signal having some predetermined signal level Vshs. A resulting change in Vp at the first input of comparator 202 may then be converted to a digital code by first figuring out the coarse code (i.e., by performing coarse comparison) and then the fine code (i.e., by performing fine ramp comparison).

At step 400, a first ADC output value codeA may be obtained by setting Vshs equal to some intermediate value in the lower sub-range between ground and Vref/2 (e.g., Vshs may be driven to V1 minus Vref/4). In other words, the difference between Vshr and Vshs would be set equal to Vref/4. The value of codeA is indicated on the y-axis in FIG. 8.

At step 402, a second ADC output value codeB may be obtained by setting Vshs equal to some intermediate value in the upper sub-range between Vref/2 and Vref*15/16 (e.g., Vshs may be driven to Vref minus Vref*3/4). In other words, the difference between Vshr and Vshs would be set equal to Vref*3/4. The value of codeB is indicated on the y-axis in FIG. 8.

At step 404, correction amount $\epsilon_{code}$ may be computed based on codeA and codeB obtain from steps 400 and 402, respectively. In this example, since ideally codeB should be three times codeA (because Vref*3/4 is three times Vref/4), correction value $\epsilon_{code}$ can be computed by subtracting codeB from three times codeA (e.g., $\epsilon_{code}$=3*codeA−codeB). Referring back to the example of FIG. 8, adding this amount back to curve portion 352B will shift 352B up to a corrected position 352B' so that resulting overall ADC transfer curve will have no discontinuities. CodeA and codeB can be computed multiple times to obtain a sufficient sample size, as indicated by path 408.

At step 410, an average correction amount $\epsilon_{code}$' may be computed. The average correction amount $\epsilon_{code}$' may be used for the final correction code calculation. During normal operation of image sensor 16 (at step 412), the average correction amount $\epsilon_{code}$' may be selectively applied to a raw ADC output code during step 318 of FIG. 6. For example, if the coarse code is low (e.g., if correction criteria has not been met), no correction is applied. If, however, the coarse code is high (e.g., if the correction criteria is met), correction is applied by adding $\epsilon_{code}$' to the raw output code. Applying digital non-linearity correction in this way may effectively reduce non-linearity issues such as DNL.

The operations described herein is merely illustrative and do not serve to limit the scope of the present invention. If desired, a correction code can be computed based on reference voltage levels other than Vref/4 and Vref*3/4. For example, codeA may be computed when Vshs is set equal to V1 minus Vref*3/8, and codeB may be computed when Vshs is set equal to V1 minus Vref*5/8. In this example, $\epsilon_{code}$ may be computed by subtracting codeB from 5/3 times codeA (e.g., $\epsilon_{code}$=5/3*codeA−codeB). In general, code correction amount $\epsilon_{code}$ may be obtained based on codeA (e.g., a code measured when Vshr minus Vshs is equal to a*Vref) and code B (e.g., a code measured when Vshr minus Vshs is equal to b*Vref) by computing the difference between codeB measured at a first predetermined reference level and some multiple of codeA measured at a second predetermined reference level (e.g., $\epsilon_{code}$=codeA*b/a−codeB).

Correction code $\epsilon_{code}$ may be added to or subtracted from the raw ADC output. In general, any other references levels can be used for correction code computation. Moreover, the examples described in connection with FIG. 4-9 in which the ADC range is sub-ranged into two sections is merely illustrative. In general, the non-linearity correction algorithm described above can be extended to ADCs 200 with more than two sub-ranges (e.g., digital code correction may be applied to sub-ranged ramp ADCs having multi-bit coarse codes).

The non-linearity correction algorithm described herein can effectively reduce the occurrence of missing codes, reduce DNL, and help remove any mid-level signal dependent column FPN. As a result, production yield that is typically affected by missing codes or mid-level signal dependent column FPN can be improved by applying the above correction.

Figure 10:
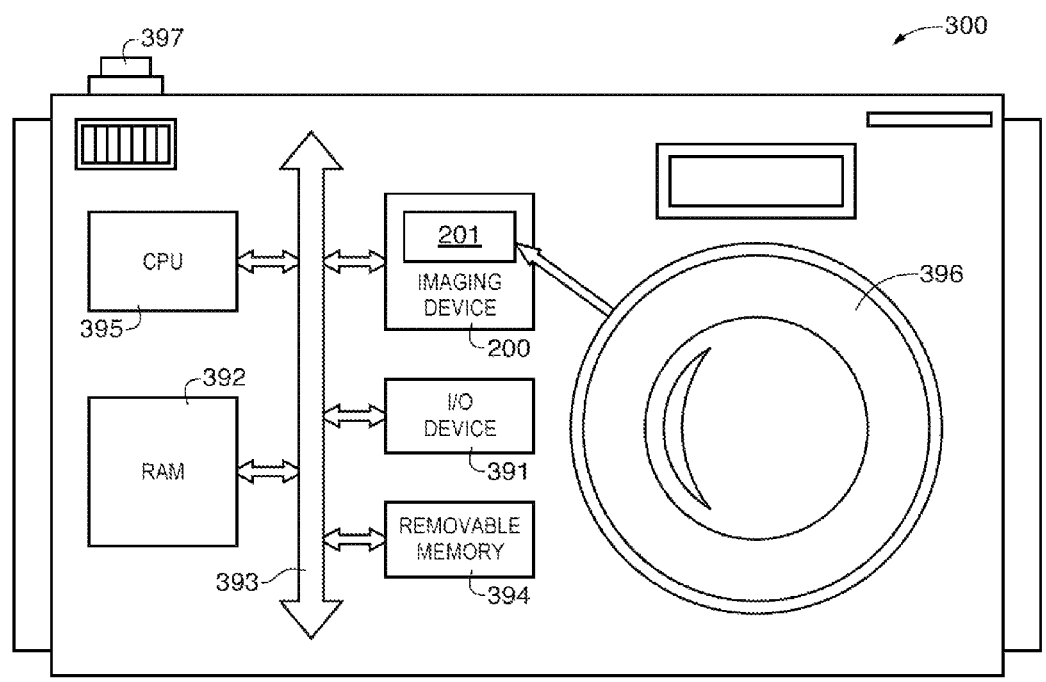
FIG. 10 is block diagram of a processor system that may include a sub-ranged ramp ADC of the type shown in FIG. 3 in accordance with an embodiment of the present invention.

FIG. 10 shows in simplified form a typical processor system 300, such as a digital camera, which includes an imaging device 200 (e.g., an imaging device 200 such as imaging sensor 16 that includes a sub-ranged ramp ADC that implements DNL error correction techniques as described above). The processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300, for example a digital still or video camera system, generally includes a lens 396 for focusing an image on pixel array 100 when a shutter release button 397 is pressed, central processing unit (CPU) 395, such as a microprocessor which controls camera and one or more image flow functions, which communicates with one or more input/output (I/O) devices 391 over a bus 393. Imaging device 2000 also communicates with the CPU 395 over bus 393. The system 300 also includes random access memory (RAM) 392 and can include removable memory 394, such as flash memory, which also communicates with CPU 395 over the bus 393. Imaging device 2000 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating an image sensor that implements code correction for sub-ranged ramp ADC circuitry. An image sensor may include an image sensor array formed from rows and columns of image sensor pixels. Each column in the image sensor pixel array may be coupled to data conversion circuitry. Each image sensor pixels may generate an image signal that can be converted to a digital signal using a corresponding sub-ranged ramp ADC.

The sub-ranged ramp ADC may be used to obtain a coarse code by comparing the image signal to a predetermined threshold signal and to obtain a fine code by comparing the image signal to a ramping voltage signal. The coarse code has a first degree of accuracy, whereas the fine code has a second degree of accuracy that is greater than the first degree of accuracy (e.g., the resolution of the fine code is higher than that of the coarse code). For example, the data converter may include a comparator, a first voltage generator that provides at least one predetermined reference threshold voltage signal to the comparator during a first time period, and a second voltage generator that provides a ramp voltage to the comparator during a second time period that is different than the first time period. The coarse code may be obtained during the first time period, whereas the fine code may be obtained during the second time period. The coarse code and the fine code may be combined to produce a raw output code.

The non-linearity code correction amount may be applied to the raw output code only when the coarse code satisfies predetermined criteria (e.g., only when the coarse code has a given value that exceeds a predetermined threshold). The final ADC output may simply be equal to the raw output code when the coarse code is less than the predetermined threshold (without using the correction amount). In other words, the sub-ranged ADC provides a plurality of input sub-ranges, and only codes associated with a selected subset of the sub-ranges will be corrected using the non-linearity correction amount.

The non-linearity code correction amount may be computed during calibration operations prior to normal operation. A first code at a first predetermined reference voltage level may be obtained. A second code at a second predetermined reference voltage level may be obtained. The non-linearity code correction amount may be computed based on the first and second codes. In particular, the non-linearity code correction amount may be computed by computing a difference between the second code and some multiple of the first code.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an imaging device having an image sensor pixel, comprising:
    generating an image signal with the image sensor pixel;
    obtaining a coarse code by comparing the image signal to a predetermined threshold signal;
    obtaining a fine code by comparing the image signal to a ramping voltage signal;
    combining the coarse code and the fine code to produce a raw output code;
    selectively applying a correction amount to the raw output code when the coarse code has a given value; and
    outputting the raw output code without applying the correction amount when the coarse code has a value other than the given value.

2. The method defined in claim 1, wherein applying the correction amount comprises applying the correction amount to the raw output code only when the coarse code has the given value.

3. The method defined in claim 1, wherein the imaging device includes a sub-ranged ramp analog-to-digital converter, and wherein obtaining the coarse and fine codes comprises obtaining the coarse and fine codes with the sub-ranged ramp analog-to-digital converter.

4. The method defined in claim 1, further comprising:
    obtaining a first code at a first predetermined reference level;
    obtaining a second code at a second predetermined reference level; and
    computing the correction amount based on the first and second codes.

5. The method defined in claim 4, wherein computing the correction amount comprises computing a difference between the second code and some multiple of the first code.

6. The method defined in claim 1, wherein the coarse code has a degree of accuracy that is less than that of the fine code.

7. The method defined in claim 6, wherein the coarse code is obtained before the fine code.

8. A method for operating an imaging device, comprising:
    with a data converter, obtaining a first code at a first predetermined signal voltage level;
    with the data converting, obtaining a second code at a second predetermined signal voltage level; and
    computing a non-linearity code correction value based on the first and second codes by computing a difference between the second code and some multiple of the first code.

9. The method defined in claim 8, wherein the data converter comprises a sub-ranged ramp analog-to-digital converter.

10. The method defined in claim 9, wherein the data converter includes a comparator and first and second voltage generators, the method further comprising:
    with the first voltage generator, providing at least one predetermined reference voltage to the comparator during a first time period; and
    with the second voltage generator, providing a ramp voltage to the comparator during a second time period that is different than the first time period.

11. The method defined in claim 10, further comprising:
    with the data converter, obtaining a coarse code during the first time period and obtaining a fine code during the second time period.

12. The method defined in claim 11, further comprising:
    concatenating the coarse code and the fine code to obtain a raw output code; and
    selectively applying the non-linearity code correction value to the raw output code only when the coarse code exceeds a predetermined threshold.

13. The method defined in claim 8, further comprising:

computing additional non-linearity code correction values; and computing an average non-linearity code correction value based on the non-linearity code correction value and the additional non-linearity code correction values.

14. A system, comprising:

a central processing unit;

memory;

input-output circuitry; and an imaging device, wherein the imaging device comprises:

a pixel array;

a lens that focuses an image on the pixel array; and an image sensor comprising:

a plurality of image sensor pixels coupled to a column line;

a sub-ranged ramp analog-to-digital converter that is coupled to the column line and that is used to produce a raw output code; and control circuitry configured to apply a non-linearity correction amount to the raw output code to produce a final corrected digital output code, wherein the sub-ranged ramp analog-to-digital converter comprises:

a comparator having a first input that receives image signals from the plurality of image sensor pixels and a second input;

a reference voltage generator that supplies predetermined reference voltage signals to the second input of the comparator during determination of the coarse code; and a ramp voltage generator that supplies a series of monotonically decreasing voltage signals to the second input of the comparator during determination of the fine code.

15. The system defined in claim 14, wherein the sub-ranged ramp analog-to-digital converter is used to generate a coarse code and a fine code, and wherein the coarse code has a degree of accuracy that is less than that of the fine code.

16. The system defined in claim 15, wherein the control circuitry produces the raw output code by combining the coarse code with the fine code.

17. The system defined in claim 16, wherein the control circuitry is further configured to selectively apply the non-linearity correction amount to the raw output code only when the coarse code satisfies predetermined criteria.

\* \* \* \* \*